United States Patent [19]
Mohr

[11] Patent Number: 5,170,401
[45] Date of Patent: Dec. 8, 1992

[54] HIGH INTEGRITY SINGLE TRANSMISSION LINE COMMUNICATION SYSTEM FOR CRITICAL AVIATION INFORMATION

[75] Inventor: Glen E. Mohr, Walker, Iowa

[73] Assignee: Rockwell International Corporation, Seal Beach, Calif.

[21] Appl. No.: 463,941

[22] Filed: Jan. 8, 1990

Related U.S. Application Data

[63] Continuation-in-part of Ser. No. 202,756, Jun. 2, 1988, abandoned.

[51] Int. Cl.⁵ .............. G06F 11/10; G06F 11/16; H04L 1/22
[52] U.S. Cl. .................. 371/68.1; 371/68.2; 371/37.1
[58] Field of Search .............. 371/68.1, 68.2, 68.3, 371/37.1

[56] References Cited

U.S. PATENT DOCUMENTS

| | | | |
|---|---|---|---|
| 3,517,171 | 6/1970 | Avizienis . | |
| 3,805,235 | 4/1974 | Foster et al. | 371/68.2 |
| 4,101,958 | 7/1978 | Patterson et al. | 371/68.3 |
| 4,159,468 | 6/1979 | Barnes et al. . | |
| 4,332,027 | 5/1982 | Malcolm et al. | 370/94 |
| 4,368,534 | 1/1983 | Sibley . | |
| 4,471,486 | 9/1984 | Sibley . | |
| 4,479,217 | 10/1984 | Philippides . | |
| 4,541,094 | 9/1985 | Stiffler et al. | 371/68.3 |
| 4,573,045 | 2/1986 | Galin | 340/825.5 |
| 4,593,396 | 6/1986 | Anderson, Jr. . | |
| 4,623,999 | 11/1986 | Patterson | 371/37 |
| 4,700,350 | 10/1987 | Douglas et al. | 371/37 |
| 4,707,693 | 11/1987 | Hessel | 370/85 |
| 4,723,243 | 2/1988 | Joshi et al. | 371/37 |
| 4,771,429 | 9/1988 | Davis et al. | 371/37 |
| 4,809,273 | 2/1989 | Jackowski et al. | 371/37 |
| 4,843,608 | 6/1989 | Fu et al. | 371/68.1 |
| 4,916,696 | 4/1990 | Funakubo | 371/68.3 |

*Primary Examiner*—Charles E. Atkinson
*Attorney, Agent, or Firm*—Gregory G. Williams; M. Lee Murrah; H. Fredrick Hamann

[57] ABSTRACT

A high integrity data communication system for use with critical aviation information on a single transmission line which also utilizes code generators at the transmitter and receiver ends together with means for comparing the outputs of the code generators thereby authenticating the information at the receiver end.

4 Claims, 2 Drawing Sheets

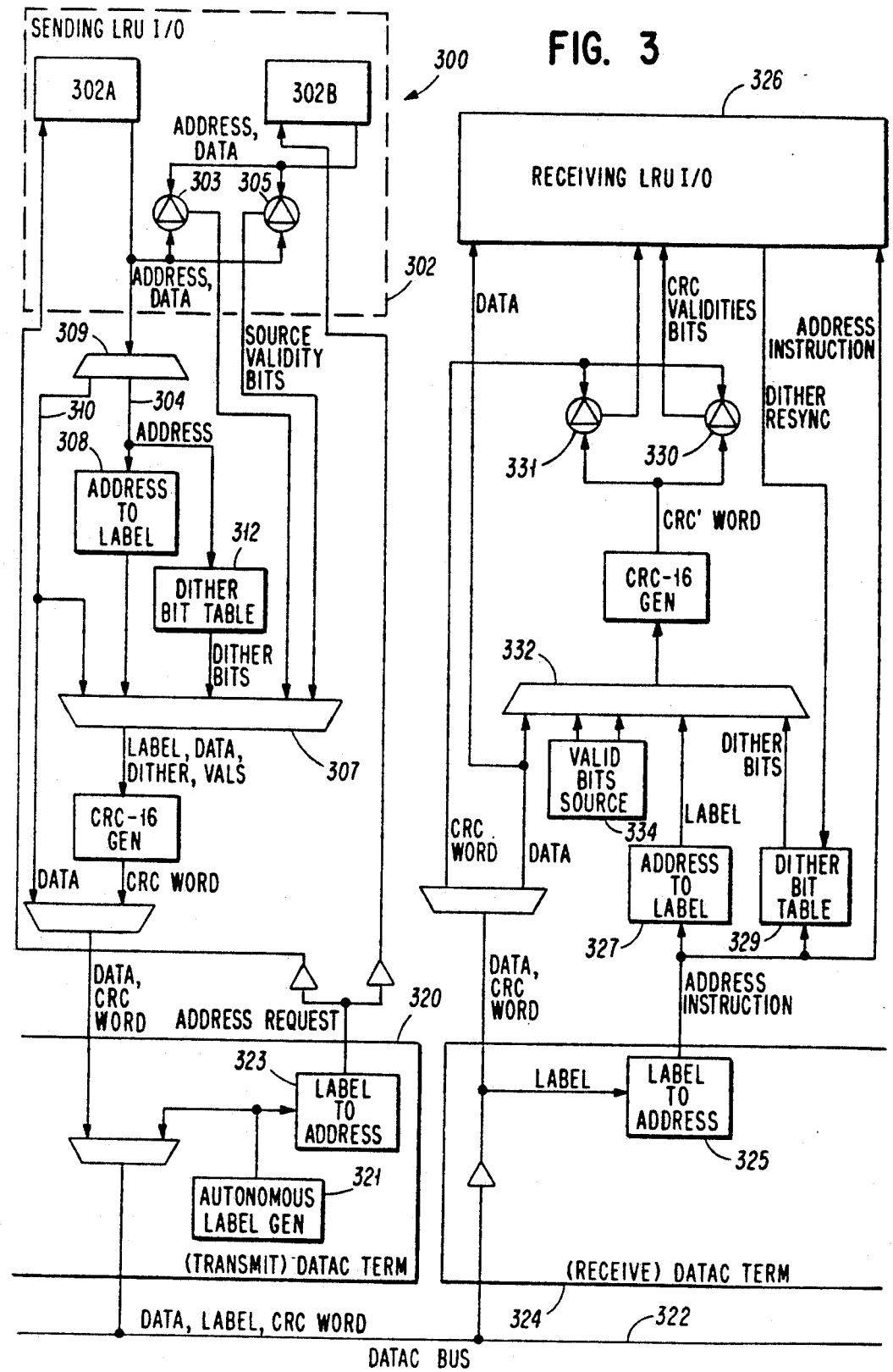

HIGH INTEGRITY SINGLE TRANSMISSION LINE COMMUNICATION SYSTEM FOR CRITICAL AVIATION INFORMATION

This application is a continuation-in-part of application Ser. No. 202,756 filed Jun. 2, 1988, now abandoned.

BACKGROUND OF THE INVENTION

The present invention generally relates to aircraft communication systems, and more particularly is concerned with extremely high integrity data communication systems for critical aviation information transmitted on a single transmission line.

In recent years, the aviation industry has been involved in a seemingly never ending quest to enhance the safety and performance of modern aircraft. One particular area in which avionics engineers have expended much effort and achieved many successes, is in the substitution of completely electronic systems for the conventional mechanical systems of the past. A prime example of these efforts is in the area of "fly by wire" aircraft. This "fly by wire" concept involves the substitution of electrical and optical systems for the conventional mechanical systems which actuate the most basic flight control such as engine throttle, wing flaps, ailerons, horizontal stabilizer, and rudder functions. In the past, these functions have been typically achieved by connecting cables, gears or levers from the cockpit back through the aircraft fuselage to the actuators. The replacement of these often quite heavy and bulky mechanical systems with smaller and lighter electrical and optical systems has obvious advantages, another not so obvious advantage is that it allows for integration of additional functions i.e. flight envelope protection. These advantages are especially desirable with the current aspirations by airframe manufacturers to produce highly fuel efficient aircraft with enhanced safety characteristics.

Numerous methods for replacing the cables and levers have been proposed, with the most generally accepted idea being to generate redundant electronic signals at the cockpit controls and other sensors which are then processed by multiple independent computational elements. Each computational element or channel produces an output instance. These independent instances make it possible to detect faults such that an output can be judged good or bad with an extremely high level of integrity. Outputs are then transmitted through multiple electrical transmission lines or fiber optics to the actuators. A data transmission system such as this must be of extremely high integrity. Data corruption can occur during the transmission of the signal along the electrical transmission line due to electromagnetic interference from other sources within the aircraft and by, among other things, faults within the transmit or receive devices. Exposure to undetected or latent faults including generic design and manufacturing faults must be eliminated in order to produce an extremely high integrity system.

In the past, in order to ensure that the critical flight control data was unaltered during transmission it would be sent along two or more separate and independent transmission lines. This allowed for a comparison at the receiving end of the data coming down the separate lines.

While this method of dual independent transmission lines has been widely used in the past, it does have several disadvantages. The paramount problem with this conventional approach is in the added weight and installation cost of the dual lines. Also the cost and power requirements of a parallel and separate system is unattractive.

Consequently, a need exists for the improvement in high integrity data communication systems for critical aviation information which does not require the use of separate and independent transmission lines but at the same time retains the integrity of that critical information.

SUMMARY OF THE INVENTION

It is an object of the present invention to provide a compact and light weight extremely high integrity data communication system.

It is a feature of the present invention to utilize a single transmission line for critical flight control information.

It is an advantage of the present invention to achieve a substantial weight reduction, by the elimination of the need for dual independent transmission lines.

It is another object of the present invention to provide an extremely high integrity data communication system.

It is another feature of the present invention to include a data encoder to manipulate the data to be transmitted in a predetermined fashion.

It is another advantage of the present invention to allow for the transmission of the original data together with an individualized encoded key or CRC word, which contains elements of data (value) and the identity of the data.

The present invention provides an extremely high integrity data communication system that is designed to fulfill the aforementioned needs, satisfy the earlier propounded objects, include the above described features, and achieve the previously stated advantages. The invention is carried out in a "dual channel-less" approach, in the sense that separated and independent transmission lines are not used for integrity. Instead, the data is transmitted through the same transmission with an encoded signature or keyword which uniquely relates to the original data. The encoding algorithm is chosen to minimize exposure to fault correlation i.e. the possibility of a fault changing the data and or keyword in such a manner that the data corruption is not detected. The term fault herein shall be construed to mean error. The information is transmitted, first in its original form followed by the encoded keyword. This allows for the transmission of non-identical signals, in the format sense, but the signals are still capable of use as comparisons for each other. The original data can be encoded by the receiving unit and compared to the earlier encoded and transmitted keyword data.

Accordingly, the present invention includes a data communication system which transmits critical flight control information in an extremely high integrity fashion, by utilizing an encoder in conjunction with a single transmission line.

BRIEF DESCRIPTION OF THE DRAWINGS

The invention may be more fully understood by reading the following description of a preferred embodiment of the invention in conjunction with the appended drawings wherein:

FIG. 3 is a block diagram representation of a preferred embodiment of the present invention which includes a dither bit table at the input to each CRC generator.

DETAILED DESCRIPTION

Throughout this description the terms below shall be given the following definitions: "Critical Data" means data that requires extremely high integrity. "CRC" shall mean a cyclic redundancy code and CRC 16 or CRC 32 are used to define cyclic redundancy code generators with 16 residue bits and 32 residue bits respectively. "DATAC" shall mean Digital Autonomous Terminal Access Communication which may also be referred to as an AEEC 629 periodic-aperiodic multi-transmitter bus communication system. "Extremely High Integrity Information" shall mean information where the probability of corrupted data being accepted as valid data is less than 10 to the minus 9 per hour or event. "Integrity" shall mean the ability of the data user to differentiate between valid data and corrupted or missing data. "LRU" shall mean line replaceable unit. "Fail Passive" shall mean a configuration in which a single fault may cause loss of function with a warning. "Fail Operational" shall mean a configuration in which a single fault may cause reconfiguration to fail-passive with a warning. "Fail Operational$_2$ shall mean a configuration in which a single fault may cause reconfiguration to fail-operational with a warning.

Figure 1:
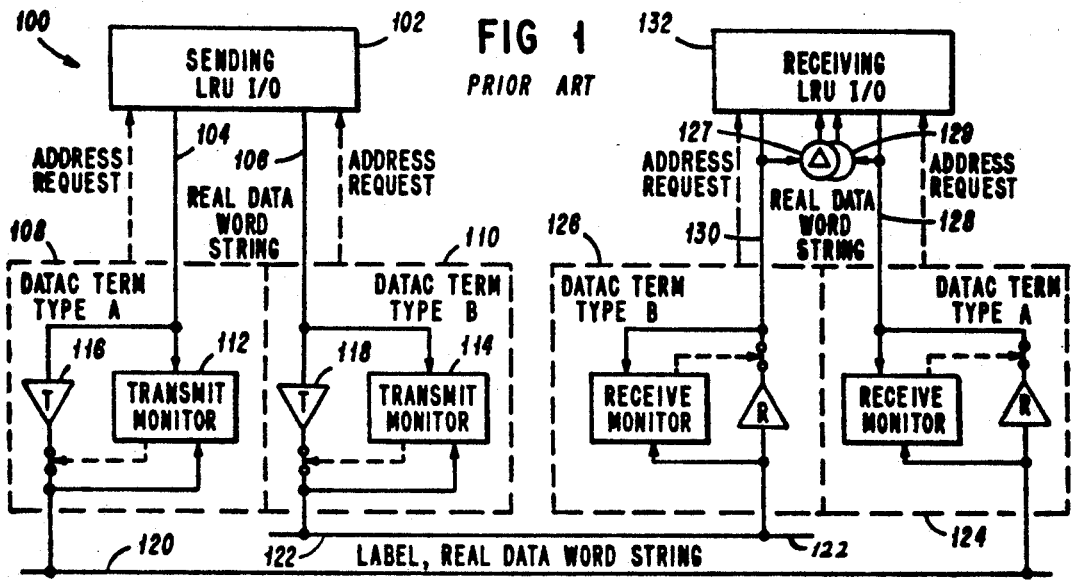
FIG. 1 is a schematic representation of a prior art data communication system which utilizes a separated and independent dual transmission line system.

Referring now to the drawings, and more particularly to FIG. 1, there is shown a dual independent transmission line data communication system of the prior art, generally designated 100, having sending LRU I/O 102. LRU 102 typically is capable of producing identical independent signals on a first line 104 and a second line 106 for reception by a first terminal 108 and a second terminal 110, respectively. Terminals 108 and 110 can be identical devices and are labeled as "DATAC TERM" "TYPE A" and "TYPE B", respectively. These terminals 108 and 110 are preferably very large scale integrated circuits which may be characterized as being Digital Autonomous Terminal Access Communication terminals or periodic-aperiodic multi-transmitter bus terminals as described by AEEC 629 paper, which are commonly known in the Air Transport Aviation industry. For illustration purposes only, a discussion of possible functions of a DATAC terminal will be described. The first transmit monitor 112 and the second transmit monitor 114 may be similar and typically are composed of receiver and comparitor and perform the function of wrap around monitoring. The first transmitter 116 and the second transmitter 118 also may be functionally identical and perform the function of parallel to serial conversion, parity insertion, and manchester encoding. The output of terminals 108 and 110 are sent on first transmission line 120 and second transmission line 122, respectively. Both transmission lines 120 and 122 are capable of transmitting the label information as well as the real data word strings. Lines 120 and 122 are received by terminals 124 and 126, respectively, which may be similar to terminals 108 and 110 respectively and perform the function of manchester decoding, parity checking, and serial to parallel conversion. The outputs of terminal 124 and 126 are on output lines 128 and 130 respectively. The signals on lines 128 and 130 are compared by dual independent comparitors 127 and 129 and finally received by receiving LRU 132.

The advantage of using parallel lines 120 and 122 is to provide for separate and independent lines and thereby provide a high integrity comparison ability. The disadvantage of such a design is that it requires twice as many lines as a single line system. Moreover, it is also required to have twice as many terminals and generic terminal types which results in extra cost, power consumption, weight and volume.

Figure 2:
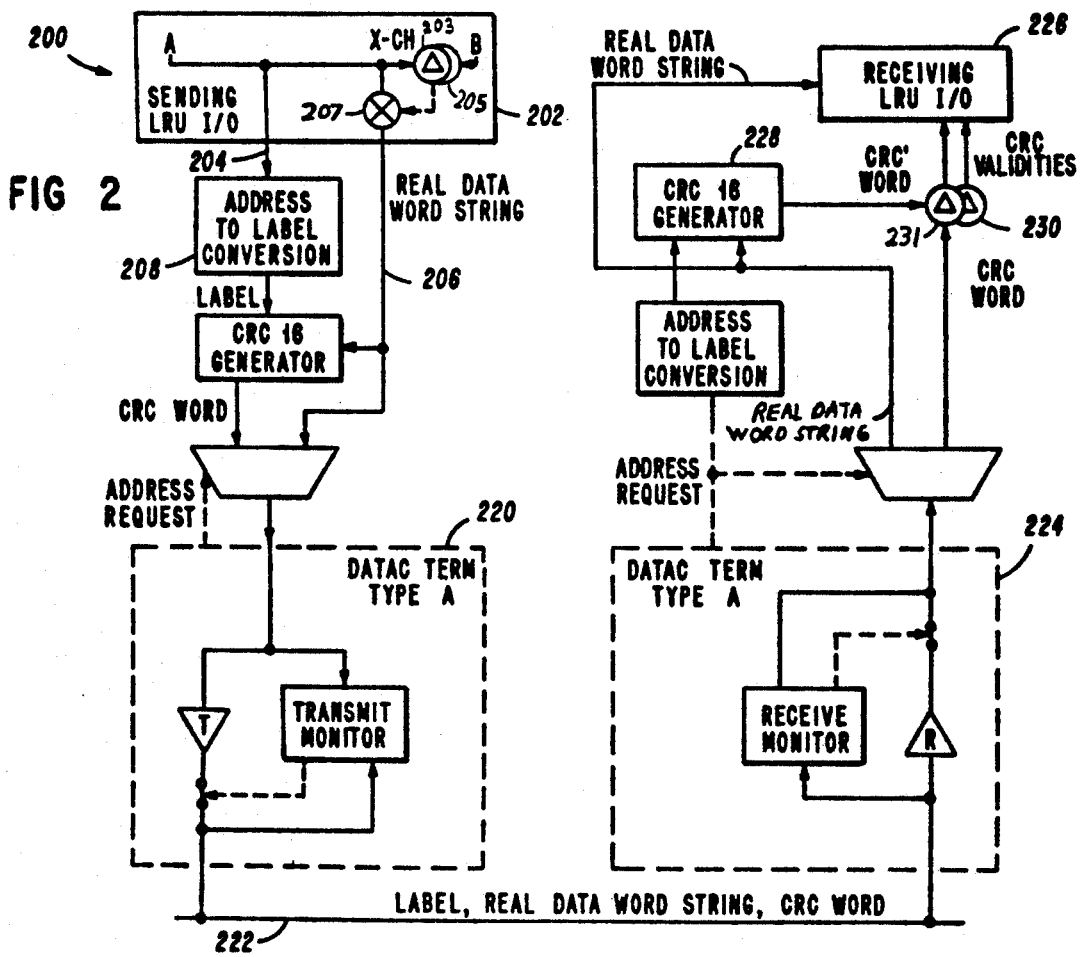
FIG. 2 is a block diagram representation of a preferred embodiment of the present invention which clearly shows the use of a single transmission line in conjunction with an encoder at the transmitting end and also an encoder at the receiving end.

Now referring to FIG. 2, there is shown a data communication system of the present invention, generally designated 200, which includes a sending LRU I/O 202, which may be identical to LRU 102 of the prior art (FIG. 1) except that LRU 202 has an additional capability of comparing the input on lines 202A and 202B in order to confirm the identical nature of the information on each line. This comparison takes place at dual comparators 203 and 205 (which are similar to dual comparators 230 and 231, discussed below). As shown in FIG. 2, the result of the comparison of 202A and 202B by dual comparators 203 and 205 is signals input into mixer 207. These signals may be of any type which are attached to the signal on line 202A, as an addendum. For example, if both the dual comparators 203 and 205 detect that 202A and 202B have identical signals then a pair of validity bits are concatenated at mixer 207 to the end of the real data and address word string on line 202A to become the real data word string on line 206.

This provides the essential ability to have an extremely high integrity communication system which would not be possible if the signals on line 202A and 202B were not compared and assumed to be valid. Line 204 is connected with address to label conversion 208, which may be a PROM look-up table and performs the function of converting a local data address to a system label. The output of convertor 208 is input into a CRC-16 generator, which is a cyclic redundancy code generator which produces a 16 bit pseudo random output which corresponds to its input. This output is commonly referred to as a CRC word and is essentially a pseudo random encodement of the label and the real data word string. This CRC word and the real data word string, less the validity bits mixed in at mixer 207, are serially input into DATAC terminal 220, which can be similar to the terminal 108 described above. The output of terminal 220 is sent along the single transmission line 222 to the receiving terminal 224, which can be similar to the terminal 124 described above. The output of terminal 224 is essentially the CRC word serially with the real data word string, less the validity bits, both supplied to the receiving LRU 226 independent channels and the receiving end CRC 16 generator 228. The real data word string, less the validity bits mixed in at mixer 207 which are replaced by assumed valid bits, is input into the CRC generator 228 along with the output of the local address to label converter and a pseudo random CRC' word is output. The transmitted CRC word is then compared to the CRC' word by dual comparators 230 and 231, which output validity signals to the receiving channels in LRU 226 if the words match. If the CRC' and CRC word match, then the real data is known to of extremely high integrity because;

1) the validity bits which are mixed in at mixer 207 must have been valid to match the assumed valid bits used to generate the CRC' word, and
2) the real data and label must have been transmitted without corruption.

While the description of the invention above, and as further shown in FIG. 2, relates to a fail passive system, it can be easily modified to include fail operational and fail operational squared systems. It is believed that these modifications are mere extensions or duplications of the present invention and that they should be considered an integral part hereof.

Now referring to FIG. 3, there is shown a communication system of the present invention, generally designated 300, which includes a sending LRU I/O 302 which may be similar to LRU 202 of FIG. 2, especially since it has the capacity of comparing the output from sources 302A and 302B. The output of sources 302A and 302B are both address and data information. The input into sources 302A and 302B are address requests originating from DATAC terminal 320, which originates all transmission across the DATAC bus 322 by generating a label in the autonomous label generator 321 which is converted to an address by label to address convertor 323. The address requests are then input into sources 302A and 302B and are transmitted out of sources 302A and 302B with the data corresponding to each address. The output of sources 302A and 302B are input into comparators 303 and 305 which will produce source validity bits in response to the comparison. The address and data output from source 302A is separated at separator 309 into a data line 310 and an address line 304. The address line 304 is input into both the address to label convertor 308 and to the dither bit table 312. Mixer 307 is used to combine the source validity bits from comparators 303 and 305, the dither bits from the dither bit table 312, the label from the address to label convertor 308 and data from line 310. This label, data, dither and validity information is input into CRC 16 generator which outputs a CRC word which is then combined with the data on line 310 and input into the DATAC transmission terminal 320 where it is combined with the previously generated label from the autonomous label generator 321 and is transmitted along the DATAC bus 322 and is received by the DATAC receiving terminal 324 where the label information is split off and supplied to a label to address convertor 325 which provides an address instruction to address to label convertor 327 and dither bit table 329 and also to receiving LRU 326. The data and CRC words which were transmitted over DATAC bus 322 and received by DATAC receiving terminal 324 are output by terminal 324 where the CRC word is provided to comparators 331 and 330, and the data is provided to receiving LRU 326 and to mixer 332. Also, input into mixer 332 are validity bits from validity bit source 334 which outputs validity bits which would correspond to the source validity bits which would be output from comparators 303 and 305 if the address and data information from sources 302A and 302B were identical. Also input into mixer 332 is label information which is output from address to label convertor 327 and dither bits which are output from dither bit table 329. The output from mixer 332 is input into a CRC 16 generator which produces a CRC' word which is applied to both comparators 331 and 330 which output CRC validity bits to the receiving LRU 326. If these CRC validity bits signify that the CRC word and the CRC' word input into comparators 331 and 330 are identical, then the data received by receiving LRU 326 can be received as being extremely high integrity for the address instruction which itself is also input into receiving LRU 326.

The communication system 300 provides for enhanced integrity of the system, when compared with the communication system 200 of FIG. 2, because of the inclusion of the dithered bits into the CRC 16 generators.

It is extremely unlikely, but possible, that during the transmission of the data, label, and CRC word on the DATAC bus 322 that either the data or label could be corrupted, and during the same transmission the CRC word could also be corrupted and corrupted in a fashion such that the corrupted CRC word would be the output of a CRC 16 generator, if the corrupted data or label were its input. If the data transmitted is data corresponding to a continuously changing value such as would be the case for an aileron position sensor then the corrupted data and its correspondingly corrupted CRC word would be more likely detected in later transmissions. However, some data transmitted along the DATAC bus will correspond to parameters which are static over extended periods of time such as whether or not the landing gear has been retracted. The dither bit table 312 is provided so that such static data may be made more dynamic by dithering a bit if necessary and thereby forcing the CRC word to change each time the label is transmitted even if the data remains static. It is contemplated that the dither bit table may be a single dither bit in which sequential transmission of a static data would have an alternating 0 or 1 bit annexed thereto, thereby creating a dynamic characteristic of the static data in a predetermined fashion. However, 2 and 4 bit counters are also contemplated the receiving LRU 326 must have a means to initially syncronize with the transmitter and to reestablish syncronization if there is a fault. The dither bit table 329 is utilized to provide dithered bits for the appropriate address to the mixer 332. Also the receiving LRU is capable of providing a resync signal to dither bit table 329 in order to allow dither bit table 329 to sync with dither bit table 312.

Consequently, the monitoring of static data of certain parameters may be made dynamic by the introduction of dithered bits and thereby generating a dynamic CRC word in response to a static data input.

It is thought that the data transmission system of the present invention and many of its attendant advantages, will be understood from the foregoing description, and it will be apparent that various changes may be made in the form, construction, and the arrangement of the parts, without departing from the spirit and scope of the invention, or sacrificing all of their material advantages, the form hereinbefore described being merely preferred or exemplary embodiments thereof.

I claim:

1. A data communication system, for use with critical aviation data, the system comprising:
   a. a first signal source for outputting critical aviation data, which includes both address and real data components;
   b. a second signal source for outputting critical aviation data which includes both address and real data components;
   c. a comparitor means, coupled with said first signal source and said second signal source to compare the outputs of said first and said second signal sources to monitor the integrity of said outputs as being of extremely high integrity;

d. an address to label converter coupled with said first signal source for receiving said address component from said first signal source and thereby converting said address to a label output;

e. a CRC generator coupled with and receiving real data from said second signal source and receiving label output data from said address to label converter, said CRC generator outputting a CRC word;

f. a transmitter device coupled with said CRC generator for receiving said CRC word and for coupling with said second signal source for receiving said real data;

g. a single transmission line connecting with said transmitter for transmitting said label output, said real data and said CRC word;

h. a receiver for receiving said label output, said real data and said CRC word from said transmission line, said receiver outputting said CRC word said real data and an address request;

i. a second address to label converter for receiving said address request and for converting said address request to a second label output;

j. a second CRC generator for receiving said real data together with said second label output and thereby generating a second CRC word;

k. a comparitor for receiving said CRC word and said second CRC word and comparing said words for an identical nature and emitting CRC validity signal if said CRC word is identical with said second CRC word; and l. a high integrity multi-channel line replaceable unit for receiving said real data and said CRC validity signals, whereby, the extremely high integrity real data from said first signal source and said second signal source are compared to maintain an extremely high integrity nature and said real data is used to generate a CRC word which is transmitted through the transmitter and the single transmission line to the receiver where the CRC word is compared with a newly generated second CRC word which is generated from the real data, the second CRC word is compared with the first CRC word to determine that the input into the second CRC generator is identical to the input to the first CRC generator, thereby authenticating the nature of the real data which is input into the line receiving unit.

2. A data communication system comprising:

a. a plurality of signal sources, for generating a plurality of data signals;

b. means for maintaining the integrity of said signals from said plurality of signal sources;

c. means for generating a first identifying code for the data signal;

d. a transmitter means coupled with said plurality of signal sources and said means for generating, said transmitter transmitting an output of said data signal and said first identifying code;

e. a single transmission line coupled with said transmitter for carrying said output;

f. a receiver coupled to said transmission line for receiving and outputting said output of said transmitter which includes said data signal and said first identifying code;

g. means for receiving from said receiver, said data signal and generating a second identifying code which would be identical to said first identifying code if said data signal had not been altered;

h. means for comparing said first identifying code and said second identifying code; and i. means for outputting said data signal if said first identifying code is identical to said second identifying code.

3. A data communication system, of the type capable of detecting errors during generation and transmission of messages, said system comprising in operative combination;

a sending LRU having a first signal source therein, for outputting critical aviation data which includes both address and real data components, and further having a redundant second signal source therein for outputting critical aviation data which includes both address and real data components;

said first signal source and said second signal source outputting critical aviation data of an identical nature;

a receiving LRU, located at a remote location from said sending LRU;

a transmitter device coupled with said sending LRU;

a receiver coupled with said receiving LRU;

a single transmission line coupled with said transmitter device and with said receiver;

means for detecting errors occurring in the generation and transmission of critical data; and whereby, a data communication system is accomplished between said sending LRU and said receiving LRU by said single transmission line.

4. A data communication system, of the type capable of detecting error occurrences during generation and transmission of both dynamic and static messages, said system comprising in operative combination;

a sending LRU having a first signal source therein, for outputting critical aviation data which includes both address and real data components, and further having a redundant second signal source therein for outputting critical aviation data which includes both address and real data components;

said first signal source and said second signal source outputting critical aviation data of an identical nature;

means for comparing said first signal source and said second signal source to confirm the identical nature of said first signal source and second signal source and thereby generating source validity bits;

means for separating the real data and the address from said first signal source;

means for converting said address to a label;

means for producing dithered bits in response to a sequence of identical addresses;

means for mixing said validity bits, said dither bits, said label and said real data to create a label, data, dither, validity bit stream;

means for generating a psuedo random code corresponding to the label, data, dither validity, bit stream;

a receiving LRU located at a remote location from said sending LRU;

a transmitter device coupled with said sending LRU for transmitting said psuedo random code and said real data;

a receiver coupled with said receiving LRU;

a transmission line coupled with said transmitter device and with said receiver; and means for detecting errors occurring in the generation and transmission of critical data;

whereby an extremely high integrity data communication system is accomplished between said sending LRU and said receiving LRU by a single transmission line.

* * * * *